(12) United States Patent
Schlezinger et al.

(10) Patent No.: US 11,072,502 B2
(45) Date of Patent: Jul. 27, 2021

(54) SUBSTRATE TILT CONTROL IN HIGH SPEED ROTARY SORTER

(71) Applicant: Applied Materials, Inc., Santa Clara, CA (US)

(72) Inventors: Asaf Schlezinger, Sunnyvale, CA (US); Markus J. Stopper, Voerstetten (DE)

(73) Assignee: Applied Materials, Inc., Santa Clara, CA (US)

( * ) Notice: Subject to any disclaimer, the term of this patent is extended or adjusted under 35 U.S.C. 154(b) by 211 days.

(21) Appl. No.: 16/358,478

(22) Filed: Mar. 19, 2019

(65) Prior Publication Data

US 2019/0337734 A1 Nov. 7, 2019

Related U.S. Application Data

(60) Provisional application No. 62/666,469, filed on May 3, 2018.

(51) Int. Cl.
*B65G 47/91* (2006.01)
*H01L 21/683* (2006.01)
(Continued)

(52) U.S. Cl.
CPC ......... *B65G 47/911* (2013.01); *B25J 15/0616* (2013.01); *H01L 21/67271* (2013.01); *H01L 21/6838* (2013.01)

(58) Field of Classification Search
CPC ............ B07C 5/362; B07C 2501/0063; H01L 21/67271; H01L 21/6838; B25J 15/06;
(Continued)

(56) References Cited

U.S. PATENT DOCUMENTS 1,107,859 A * 8/1914 Stevens ................ B65H 29/246
271/211
3,737,051 A * 6/1973 Horino ................... B65H 31/38
414/788
(Continued)

FOREIGN PATENT DOCUMENTS

CN 201208595 Y 3/2009
JP H06048607 A 2/1994
(Continued)

OTHER PUBLICATIONS

International Search Report and Written Opinion for Application No. PCT/US2019/023000 dated Jul. 4, 2019.
(Continued)

*Primary Examiner* — Joseph C Rodriguez
(74) *Attorney, Agent, or Firm* — Patterson + Sheridan, LLP

(57) ABSTRACT

An apparatus and method for sorting a plurality of substrates is disclosed. The apparatus includes a sorting unit capable of supporting a plurality of bins, a rotatable support disposed within the sorting unit, the rotatable support rotatable about a rotational axis, a plurality of grippers coupled to the rotatable support on a common radius relative to the rotational axis, the grippers positioned to travel along a path above the bins as the rotatable support rotates, and an air nozzle configured to reorient a sorted substrate relative to a stacked substrate in a bin of the plurality of bins when released by one of the grippers into the bin.

20 Claims, 4 Drawing Sheets

(51) Int. Cl.
*H01L 21/67* (2006.01)
*B25J 15/06* (2006.01)

(58) Field of Classification Search
CPC ........ B25J 15/0616; B25J 15/065; B25J 9/04;
B25J 18/04; B65H 31/10; B65H 31/16;
B65H 2406/12; B65H 2406/13; B65H
29/245; B65H 29/246; B65H 29/247;
B65H 29/248; B65H 29/26; B65H 31/34;
B65G 47/91; B65G 47/911
See application file for complete search history.

(56) References Cited

U.S. PATENT DOCUMENTS

| | | | | |
|---|---|---|---|---|
| 4,132,400 A | * | 1/1979 | Naramore | B65H 31/40 |
| | | | | 271/211 |
| 4,753,162 A | | 6/1988 | Bubley | |
| 4,836,733 A | * | 6/1989 | Hertel | H01L 21/67259 |
| | | | | 198/341.05 |
| 4,905,979 A | | 3/1990 | Limbach et al. | |
| 5,020,475 A | * | 6/1991 | Crabb | C30B 25/10 |
| | | | | 118/719 |
| 6,309,116 B1 | | 10/2001 | Mahara et al. | |
| 6,318,945 B1 | * | 11/2001 | Hofmeister | H01L 21/67751 |
| | | | | 118/719 |
| 6,368,051 B2 | * | 4/2002 | Raaijmakers | H01L 21/67745 |
| | | | | 414/805 |
| 6,696,367 B1 | * | 2/2004 | Aggarwal | H01L 21/67778 |
| | | | | 414/935 |
| 7,604,449 B1 | * | 10/2009 | Kaveh | H01L 21/67201 |
| | | | | 414/411 |
| 7,887,276 B2 | * | 2/2011 | Natume | B66F 11/00 |
| | | | | 414/217 |
| 8,454,293 B2 | * | 6/2013 | Gilchrist | H01L 21/67772 |
| | | | | 414/217 |
| 9,341,580 B2 | * | 5/2016 | Schlezinger | H01L 21/67271 |
| 9,533,852 B2 | * | 1/2017 | Suzuki | B65H 31/34 |
| 9,630,794 B2 | * | 4/2017 | Chiwata | B41J 29/377 |
| 9,929,029 B2 | * | 3/2018 | Tobin | H01L 21/68742 |
| 10,406,562 B2 | * | 9/2019 | Stopper | B07C 5/362 |
| 10,777,436 B2 | * | 9/2020 | Stopper | H01L 21/6838 |
| 2002/0197145 A1 | * | 12/2002 | Yamamoto | H01L 21/67781 |
| | | | | 414/806 |
| 2004/0109751 A1 | * | 6/2004 | Whitcomb | H01L 21/67778 |
| | | | | 414/744.1 |
| 2013/0079913 A1 | | 3/2013 | Oza et al. | |
| 2014/0294544 A1 | | 10/2014 | Rebstock | |
| 2017/0092517 A1 | * | 3/2017 | Ohashi | H01L 21/67276 |
| 2017/0170041 A1 | | 6/2017 | Stopper et al. | |
| 2021/0163249 A1 | * | 6/2021 | Krapf | B65H 43/06 |

FOREIGN PATENT DOCUMENTS

| | | |
|---|---|---|
| JP | 3495292 B2 | 2/2004 |
| JP | 201064024 A | 3/2010 |
| JP | 2012028551 A | 2/2012 |
| JP | 5892669 B1 | 3/2016 |
| KR | 19990085867 | 12/1999 |
| KR | 100787627 B1 | 12/2007 |
| KR | 20110095023 A | 8/2011 |
| KR | 20130020103 A | 2/2013 |
| TW | 201722567 A | 7/2017 |

OTHER PUBLICATIONS

TW Office Action in related application TW 10811361 dated Oct. 20, 2020.

* cited by examiner

SUBSTRATE TILT CONTROL IN HIGH SPEED ROTARY SORTER

CROSS-REFERENCE TO RELATED APPLICATION

This application claims priority to U.S. Provisional Patent Application Ser. No. 62/666,469, filed May 3, 2018, which application is hereby incorporated by reference herein.

BACKGROUND

Field

Embodiments of the present disclosure generally relate to solar substrate inspection equipment. More specifically, embodiments disclosed herein relate to a system and method for the high speed sorting of substrates.

Description of the Related Art

Substrates, such as solar substrates, are routinely inspected during processing at independent inspection stations to ensure compliance with predetermined quality control standards. Different inspection techniques provide comprehensive data regarding products and processes. However, comprehensive inspections can be time consuming, thus reducing throughput, due to the number of inspection stations needed and the resulting transfer time of moving substrates therebetween. Thus, device manufacturers are often faced with the decision of choosing between thorough inspections with burdensome inspection/transfer times, or foregoing certain inspection processes.

As inspection processes have continued to decrease the amount of time to complete inspection steps, sorting apparatuses able to keep up with faster sorting are needed to increase throughput. However, substrates handling in these faster sorting systems sometimes create problems. For example, substrates are typically picked and stacked in bins during sorting, and the stacking process may include dropping the substrate a short distance. If the dropped substrate is tilted in an orientation that is different than another substrate that the dropped substrate is to be stacked on (e.g., a "stacked substrate"), a crack or breakage may occur when the dropped substrate makes contact with the stacked substrate.

As the foregoing illustrates, there is a need for an improved substrate inspection system for sorting inspected substrates at increased speeds and allowing for higher throughputs. Therefore, what is needed in the art is a high speed rotary sorter that controls the tilt angle of sorted substrates.

SUMMARY

An apparatus and method for sorting a plurality of substrates is disclosed. The apparatus includes, in one embodiment, a sorting unit, a rotatable support disposed within the sorting unit, the rotatable support rotatable about a rotational axis. A plurality of grippers coupled to the rotatable support on a common radius relative to the rotational axis, a plurality of bins positioned within the sorting unit below a path along which the grippers travel as the rotatable support rotates. An air nozzle disposed between the grippers and the each of the plurality of bins, the air nozzle configured to for reorient a sorted substrate relative to a stacked substrate when releases by one of the grippers into one of the plurality of bins.

In another embodiment, an apparatus adapted to sort substrates is disclosed that includes a sorting unit. The sorting unit comprises a support structure extending radially outward from an axis of rotation, at least one gripper coupled to the support structure for supporting a substrate, and a plurality of individually removable sorting bins positioned within the sorting unit, below a path along which the at least one gripper travels as the at least one gripper rotates. Each of the plurality of individually removable sorting bins includes a single air nozzle for reorienting a planar orientation of the substrate after release from the at least one gripper.

In yet another embodiment, a method of operating an apparatus for sorting a plurality of substrates in an enclosure is disclosed. The method comprises holding an inspected substrate with at least one gripper on a rotating sorting unit. Rotating the inspected substrate held by the at least one gripper about a center axis of the sorting unit to a location above a sorting bin assigned to the inspected substrate, wherein the sorting bin includes a baseplate having a plane that is angled in a non-horizontal plane. The method includes releasing the inspected substrate from the at least one gripper in a horizontal planar orientation into the assigned sorting bin, and reorienting the planar orientation of the inspected substrate prior to resting within the assigned sorting bin.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of this disclosure and are therefore not to be considered limiting of its scope, for the disclosure may be applied to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to substrate handling systems. The substrate handling system is suitable for use in a sorting system, such as those utilized in substrate inspection systems. The inspection system includes multiple metrology units adapted to analyze one or more characteristics of a substrate, including, by way of example only, thickness, resistivity, saw marks, geometry, stains, chips, micro cracks, and crystal fraction. The inspection systems may be utilized to identify defects on substrates and estimate cell efficiency prior to processing a substrate. Substrates may be transferred through the inspection system and/or between metrology units on a track or conveyor system, and then sorted via grippers coupled with the high speed rotary sorting apparatus into respective bins based upon the inspection data. The sorting apparatus maintains a sorting capability of at least 5,400 substrates per hour. Each bin includes a tilt control device for controlling an inclination or planar orientation of the substrate as it falls from the rotary sorting apparatus into the respective bin.

Figure 1:
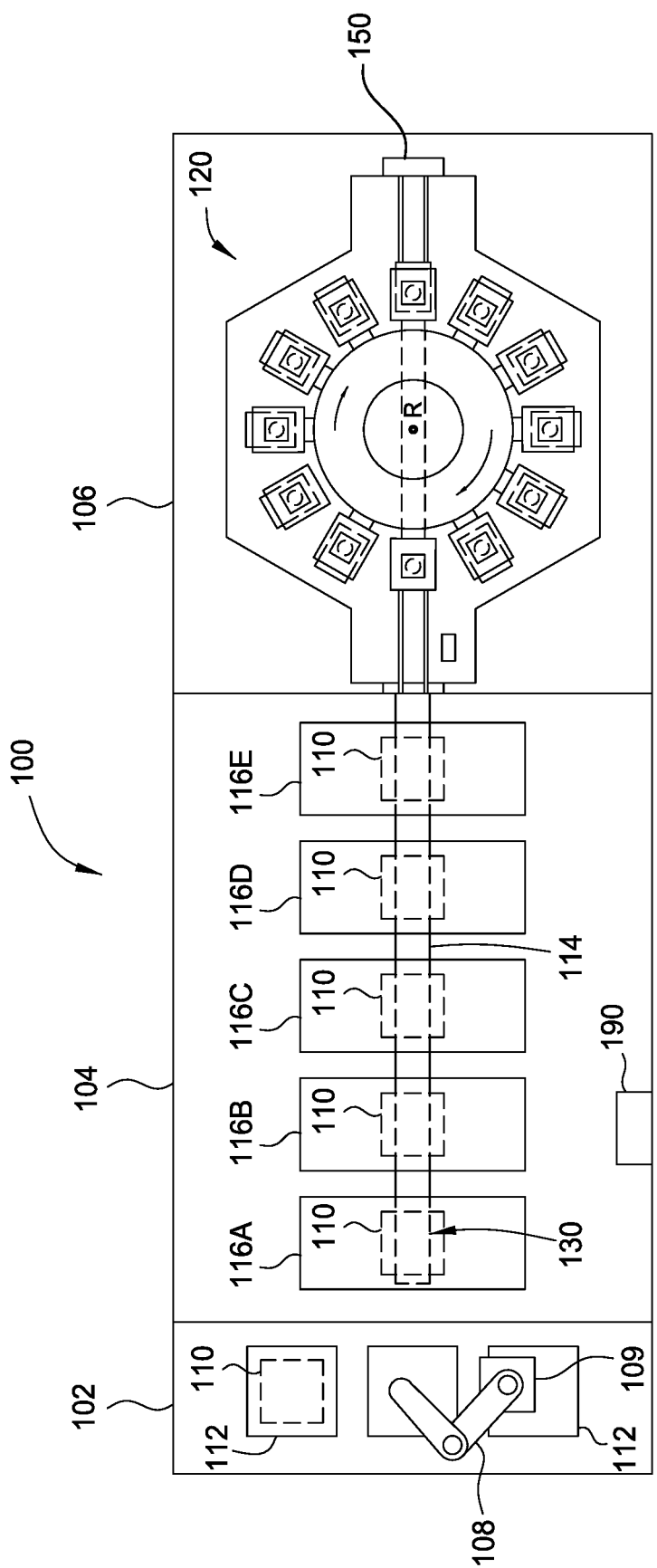
FIG. 1 illustrates a top plan view of an inspection system, according to one embodiment.

FIG. 1 illustrates a top plan view of an inspection system 100, according to one embodiment. The inspection system 100 includes a loading module 102, a modular unit 104, and a sorting unit 106.

The loading module 102 may be, for example, a loading robot or other substrate handler that loads substrates into the inspection system 100. The modular unit 104 may be, for example, a metrology unit that inspects substrates. The loading module 102, the module unit 104, and the sorting unit 106 may be, by way of example only, disposed linearly relative to another. The loading module 102 includes a transfer robot 108 having support elements 109, such as a suction element, an end effector, and gripper clamp for gripping and transferring substrates 110. The transfer robot 108 is adapted to transfer substrates 110 from one or more cassettes 112 positioned within the loading module 102 to a conveyor system 114. The conveyor system 114 may be a motor-driven conveyor system and may include one or more conveyors, such as transportation belts or tracks driven by an actuator through rollers and/or drive gears. The conveyor system 114 may be disposed in a linear arrangement to transfer substrates received from the transfer robot 108 through the modular unit 104. As such, the conveyor system 114 is disposed within the modular unit 104 and facilitates the transfer of substrates 110 through the modular unit 104. Additional modular units may be positioned between the loading module 102 and the modular unit 104, and/or between the modular unit 104 and the sorting unit 106, and/or following the sorting unit 106 to facilitate expansion of the inspection system 100.

The loading module 102 receives one or more cassettes 112. Each cassette 112 may contain substrates 110 in a stacked configuration. The substrates may be stacked, for example, horizontally or vertically. For example, each cassette 112 may include a plurality of slots therein, and each slot is configured to hold a substrate 110. By continued example, the cassette 112 may be positioned such that the substrates 110 are positioned one over another. The substrates 110 are transferred from the cassettes 112 via the transfer robot 108 to the conveyor system 114 for transfer through the system 100. The loading module 102 is in communication with a computer (shown as a controller 190) having a graphical user interface adapted to present information related to operations occurring in the loading module 102, including processing metrics, lot numbers, and the like. In one example, the computer may include a touch screen interface.

The modular unit 104 may include one or more metrology stations. In the embodiment of FIG. 1, the modular unit 104 includes five metrology stations 116A-116E. It is contemplated that the inspection system 100 may also be modified by adding or subtracting metrology stations to the modular unit 104, as space permits, rather than adding a second modular unit, thus increasing throughput and/or the number of metrology processes performed.

The metrology stations 116A-116E may include, by way of example only, any of the following: a micro-crack inspection unit, a thickness measuring unit, a resistivity measuring unit, a photoluminescence unit, a geometry inspection unit, a saw mark detection unit, a stain detection unit, a chip detection unit, and/or a crystal fraction detection unit. The micro-crack inspection unit may be, by way of example only, configured to inspect substrates for cracks, as well as to optionally determine crystal fraction of a substrate. The geometry inspection unit may be configured, by way of example only, to analyze surface properties of a substrate. The saw mark detection unit may be configured, by way of example only, to identify saw marks including groove, step, and double step marks on a substrate. The metrology stations may also include other examples beyond those listed above.

In one example and for purposes of illustration only, the metrology station 116A may be a micro-crack inspection unit as described above. By further example and for purposes of illustration only, the metrology station 116B may be a thickness measuring unit adapted to measure substrate thickness. Metrology station 116B may also, or alternatively, measure resistivity of a substrate 110. The metrology station 116B receives substrates 110 transferred along the conveyor system 114 subsequent to inspection in the metrology station 116A, which may be any type of metrology station. The metrology station 116B is disposed along the in-line path of the substrates 110 defined by the conveyor system 114 downstream of the location of the metrology station 116A. The metrology station 116B performs one or more inspection processes on a substrate 110. The inspection process occurring at metrology station 116B may be performed while the substrate is in motion; however, it is contemplated that the motion of the substrate 110 may be stopped to facilitate increased accuracy of inspection.

By further example and for purposes of illustration only, the metrology station 116C may be a photoluminescence unit configured to detect defects and/or perform impurity measurements, and metrology station 116D may be a geometry inspection unit configured to analyze the geometry and surface properties of the substrate 110.

Metrology station 116C receives substrates 110 transferred along the conveyor system 114 subsequent to the inspection thereof in the metrology station 116B. Metrology station 116D receives substrates 110 transferred along the conveyor system 114 subsequent to the inspection thereof in the metrology station 116C. Metrology station 116E receives substrates 110 transferred along the conveyor system 114 subsequent to the inspection thereof in the metrology station 116D, and so forth if additional metrology units are utilized in a linear path as shown. Additionally, in some embodiments, non-linear path inspection may be utilized. As such, substrates 110 may be transferred between metrology stations 116A-116E in a non-linear fashion, such as in a circular fashion or in an arcuate fashion.

The conveyor system 114 conveys the inspected substrates 110 from the modular unit 104 towards the sorting unit 106. The conveyor system 114 may deliver inspected substrates 110 into the sorting unit 106 to a location within reach of a substrate handler such as a rotary sorting system 120 housed with sorting unit 106. Additionally, the conveyor system 114 may continue through the sorting unit 106 to a connector 150. As such, if the sorting unit 106 is not sorting substrates 110 an inspected substrate 110 may bypass the rotary sorting system 120 of the sorting unit 106 and pass to the connector 150. Furthermore, if an inspected substrate 110 is not picked up by the rotary sorting system 120 the substrate may continue along the conveyor system 114 toward the connector 150. In certain embodiments, substrates not picked up by the rotary sorting system 120 may continue along the conveyor system 114 which may lead to a non-sorted substrate bin. In certain embodiments the sorting unit 106 may be further coupled by the connector 150 with additional units such as, by way of example only, additional inspection systems, additional sorting units, additional metrology units, etc. via the connector 150. The connector 150 may further allow the conveyor system 114 to align with a conveyor system of an additional unit such as, by way of example only, an additional inspection system, an additional sorting unit, an additional metrology units, etc.

The inspection system 100 may also include a controller 190. The controller facilitates the control and automation of the system 100. The controller 190 may be coupled to or in communication with one or more of the conveyor system 114, the loading module 102, the modular unit 104, the sorting unit 106, the transfer robot 108, and/or the metrology stations 116A-116E. The inspection system 100 may provide information to the controller 190 regarding substrate movement, substrate transferring, substrate sorting, and/or metrology performed.

The controller 190 may include a central processing unit (CPU) (not shown), memory (not shown), and support circuits (or I/O) (not shown). The CPU may be one of any form of computer processors that are used in industrial settings for controlling various processes and hardware (e.g., pattern generators, motors, and other hardware) and monitor the processes (e.g., processing time and substrate position or location). The memory (not shown) is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits (not shown) are also connected to the CPU for supporting the processor in a conventional manner. The support circuits may include conventional cache, power supplies, clock circuits, input/output circuitry, subsystems, and the like. A program (or computer instructions) readable by the controller 190 determines which tasks are performable on a substrate. The program may be software readable by the controller 190 and may include code to monitor and control, for example, the processing time and substrate position or location within the inspection system 100.

Figure 2:
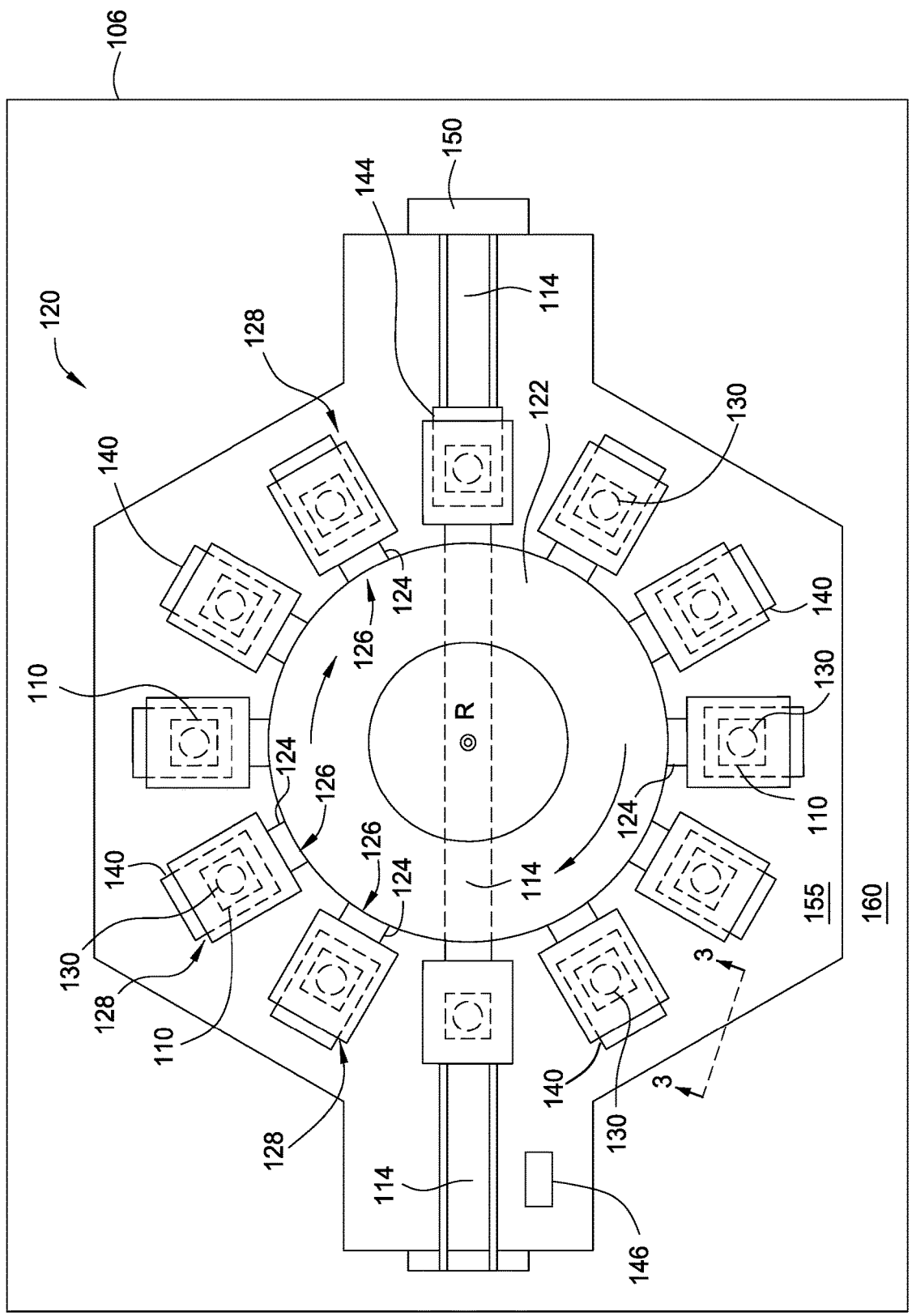
FIG. 2 illustrates a top plan view of the high speed rotary sorter of the inspection system of FIG. 1, according to one embodiment.

FIG. 2 illustrates a top plan view of the rotary sorting system 120 of FIG. 1 housed within the sorting unit 106. The rotary sorting system 120 includes a rotatable support 122 contained within the rotary sorting system 120. The rotatable support 122 has a rotational axis R. The rotatable support 122 may be a rotary disc, a circular support, a tubular structure, or any other shape for efficiently sorting substrates 110. The rotatable support 122 includes a plurality of arms 124. Each arm 124 has a first end 126 and a second end 128. The first end 126 of each arm 124 is coupled to the rotatable support 122 via a suitable connection, such as, for example, a welded connection, a pinned connection, a fastened connection, etc. The second end 128 of each arm 124 extends radially outward relative to the rotational axis R. Each arm 124 is disposed at a substantially normal angle to a base 155 of the rotary sorting system 120. The base 155 is positioned on a floor 160, which may be a floor of a fabrication facility. In one embodiment, the rotatable support 122 may include at least twelve arms 124, such as fourteen arms or sixteen arms; however it is contemplated that any number of arms 124 may be utilized, such as, by way of example only, ten or more arms 124. Each arm 124 may also include a vertically oriented support member (not shown) extending in a direction that is substantially parallel to the rotational axis R.

At least one gripper 130 is coupled to the second end 128 of each arm 124, or a gripper 130 may be coupled to a vertically oriented support member coupled to the arm 124. Each gripper 130 may be disposed on a bottom side or end of each of the arms 124 so that each gripper 130 may pick the substrate 110 once the inspected substrate 110 reaches the sorting unit 106. Each gripper 130 may be, by way of example only, a suction gripper, a claw gripper, a magnetic gripper, or a picker. In one embodiment, each gripper 130 is a Bernoulli picker. The gripper 130 picks the substrate from the conveyor system 114 in a horizontal orientation, and the substrate remains in the horizontal orientation as the gripper 130 rotates in the rotational axis R. In one example, the grippers 130 are vertically fixed such that each gripper 130 does not move in a direction parallel to the rotational axis R. The substrate retained by each gripper 130 remains coplanar from pick up from the conveyor system 114 to release from the rotary sorting system 120.

One or more sorting bins 140 are disposed radially outward of the rotational axis R on a common radius. In one embodiment, by way of example only, at least ten sorting bins 140 are utilized; however it is contemplated that any number of sorting bins 140 may be utilized, such as, for example, six, eight, or twelve sorting bins 140. The sorting bins 140 may be positioned directly below the path taken by the grippers 130 as the plurality of arms 124 are rotated by the rotatable support 122. In one mode of operation, the rotary sorting system 120 may rotate about the rotational axis R in a stepping fashion such that the rotary sorting system 120 stops to grip (i.e., pick up) a substrate 110 from the conveyor system 114 as each substrate 110 enters the sorting unit 106. The sorting bins 140 are positioned on the base 155 to receive substrates 110 from the rotary sorting system 120. The substrates 110 may be sorted into the sorting bins 140 in response to one or more substrate characteristics determined during one or more of the inspection processes performed in the metrology stations 116A-116E. The rotary sorting system 120 positions the substrates 110 over a sorting bin 140 assigned to receive substrates having at least one predefined substrate characteristic. The substrate 110 is then released from the respective gripper(s) 130 into the appropriate sorting bin 140. The sorting bins 140 may store the sorted substrates 110 as released by the grippers 130. Each of the grippers 130 is configured to transport substrates 110 from the conveyor system 114 to the respective sorting bins 140 such that major surfaces of the substrates 110 are substantially parallel to the base 155 and/or orthogonal to the rotational axis R. Releasing the substrate 110 causes the substrate 110 to free-fall a short distance before resting on a surface of another substrate in the respective sorting bin 140 as will be described in detail below.

The sorting bins 140 may each be individually removable from the sorting unit 106. Each sorting bin 140 may be removably connected with the sorting unit 106 such as, by way of example only, an individually removable drawer or container, a slide out vessel, or pull out drawer or container. By way of continued example, each sorting bin 140 may be accessible from outside the sorting unit 106 such that each sorting bin 140 may be removed from the sorting unit 106 without a technician entering the sorting unit 106. A full sorting bin 140 may be removed from the sorting unit 106 by, for example, pulling the sorting bin 140 out of the sorting unit 106. Each sorting bin 140 may be removable from the sorting unit 106 while the sorting unit 106 continues to sort substrates 110. As such, the sorting of substrates 110 may continue even though a particular sorting bin 140 is full or has been removed. Therefore, each sorting bin 140 may be emptied or replaced while sorting is occurring. Additionally, the controller 190 may count the number of substrates 110 within each sorting bin 140 via the use of a counter (not shown). As such, when a particular sorting bin 140 is full or not in place, the sorting unit 106 skips the full or removed sorting bin 140 until the full or removed sorting bin 140 is emptied or replaced. Once an empty sorting bin 140 has been replaced within the sorting unit 106 the counter may reset for that particular sorting bin 140. The counter may automatically reset each time the sorting bin 140 is replaced or emptied. A full sorting bin 140 may be emptied or replaced by an operator. As such, the sorting unit 106 may continue to rotate a substrate 110 until an assigned sorting bin 140 is available. If no sorting bin 140 is available, the sorting unit 106 may alert the operator and continue to rotate the substrate 110 until an appropriate sorting bin 140 becomes available. Once the controller 190 determines that a particular sorting bin 140 is approaching capacity or is at capacity, the controller 190 may alert the operator by sounding an alarm and/or displaying an alert.

Although not shown, it is contemplated that an additional sorting bins 140 may be positioned within the sorting unit 106 to receive substrates 110 which may inadvertently be omitted from sorting, thus preventing damage to such substrates. Additionally, a rejection bin 144 may be positioned within the sorting unit 106 to capture substrates 110 which have been rejected by one or more of the metrology stations 116A-116E of the modular unit 104. As such, the rotary sorting system 120 may deliver a damaged substrate to the rejection bin 144.

The rotary sorting system 120 may also include a yield analysis server 146 accessible by one or more access panels. The yield analysis server 146 is coupled to one or more of the loading module 102 and the metrology stations 116A-116E, and adapted to receive, collect, analyze, store, and/or report data received from the loading module 102 and the one or more metrology stations 116A-116E with respect to each substrate 110 passing therethrough.

The rotatable support 122 may be coupled with a rotary actuator (not shown), such as a pneumatic cylinder or stepper motor. The rotary actuator may rotate the rotatable support 122, such as in an indexing fashion. Upon each indexing step of the rotatable support 122, a new substrate 110 is received from the modular unit 104 via the conveyor system 114 onto the rotary sorting system 120 via each gripper 130. Additionally, and as further discussed infra, the rotatable support 122 may index each of the plurality of arms 124 over a respective sorting bin 140 and/or over a rejection bin 144, such that the substrate 110 may be released into the sorting bin 140 or the rejection bin 144. By continually moving, or index stepping, substrates 110 may be continuously removed from the conveyor system 114, thus immediately freeing the space on the conveyor system 114 for the next substrate 110. As such, the rotary motion allows each gripper 130 to interface with each sorting bin 140 so that the substrate held by the grippers 130 will be released into one of the sorting bins 140 prior to the grippers 130 rotating back to a position to receive another substrate 110. The rotary sorting system 120 will continue to move until all substrates 110 have been sorted.

In some embodiments the rotary sorting system 120 may pick up a substrate 110 delivered from the modular unit 104 via the conveyor system 114 every ⅔ of a second. In such embodiments the rotary sorting system 120 may advantageously sort at least 5,400 substrates per hour, which is a significant improvement over conventional sorting systems.

Figure 3:
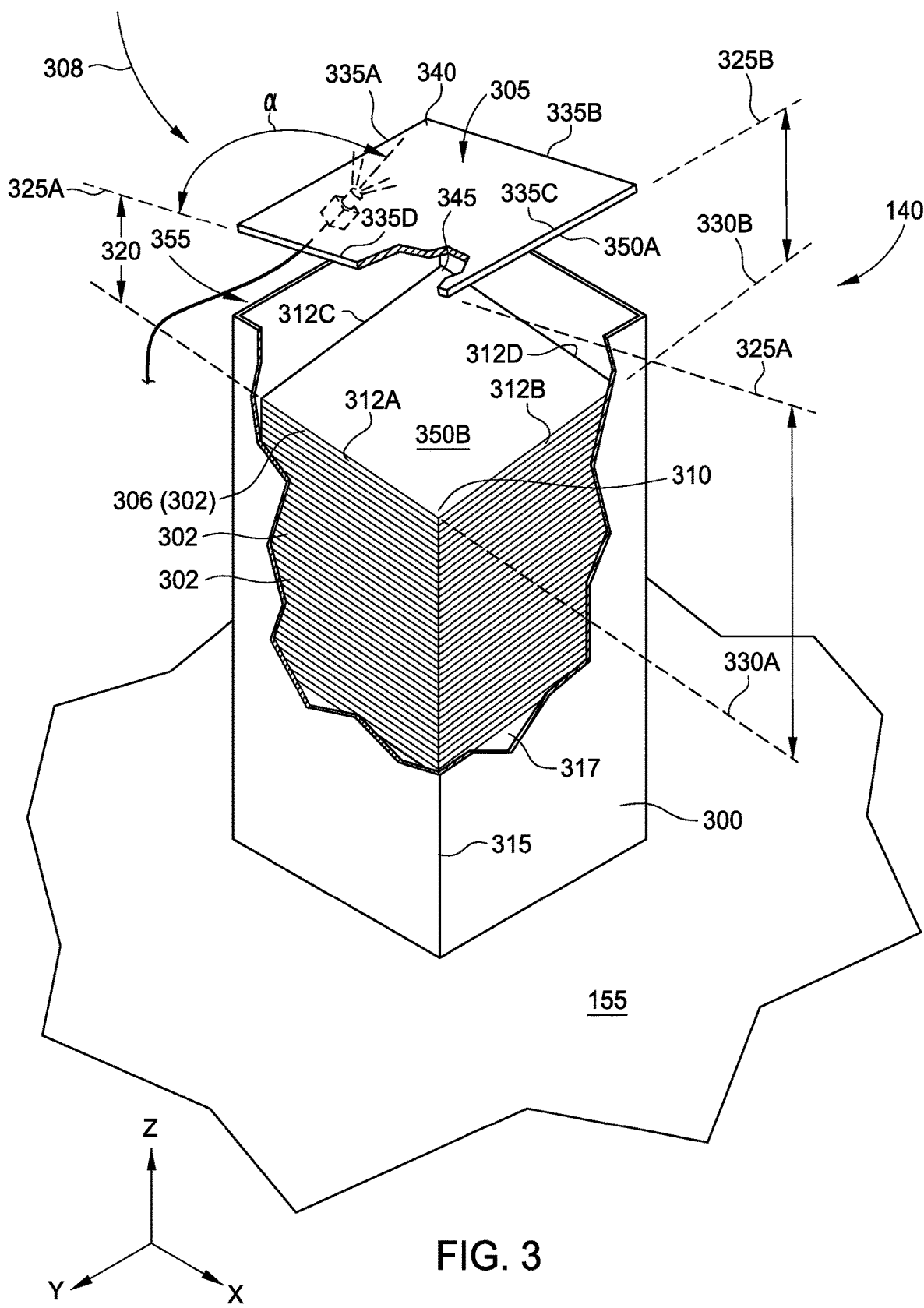
FIG. 3 is an isometric side view of one of the sorting bins of FIG. 2.

FIG. 3 is an isometric side view of one of the sorting bins 140 of FIG. 2. The sorting bin 140 includes sidewalls 300 and a portion of the sidewall 300 is partially cut-away to show a plurality of stacked substrates 302 that are deposited within the sorting bin 140. The sorting bin 140 is configured to receive a sorted substrate 305 that is suspended above the sorting bin 140 by one of the grippers 130 (shown and described in FIG. 2). The sorted substrate 305 has a cut-away portion to show a uppermost stacked substrate 306. The uppermost stacked substrate 306 was previously deposited into the sorting bin 140 by the gripper 130 and the sorted substrate 305 is to be deposited onto the uppermost stacked substrate 306 after release from the gripper 130. An arrow referenced by number 308 indicates the direction of travel of the gripper 130 as described in FIG. 2.

The sorting bin 140 is constructed and/or oriented such that a corner 310 of each of the stacked substrates 302 is aligned at a corner 315 of the sorting bin 140 at least in the Z direction. Additionally, the stacked substrates 302 are aligned within the sorting bin 140 such that adjacent sides 312A and 312B are aligned in the Z direction. The alignment of the corner 310 and/or the adjacent sides 312A and 312B of the stacked substrates 302 is provided by the construction and/or orientation of the sorting bin 140. For example, the sorting bin 140 may be tilted with respect to one or a combination of the X, Y and Z direction such that the corner 310 and/or the adjacent sides 312A and 312B of the stacked substrates 302 come to rest against the corner 315 and/or the sidewall 300, respectively. In another example, a baseplate 317 supporting the stacked substrates 302 may be tilted with respect to one or a combination of the X, Y and Z direction such that the corner 310 and/or the adjacent sides 312A and 312B of the stacked substrates 302 come to rest against the corner 315 and/or the sidewall 300, respectively.

The baseplate 317 may be moved vertically (Z direction) relative to the sorting bin 140 such that the free-fall distance of the sorted substrate 305 is reduced. In one example, the baseplate 317 may be coupled to a motor that moves the baseplate 317 vertically, or a spring that moves the baseplate 317 vertically. As such, the uppermost stacked substrate 306 may remain closer to the top of the sorting bin 140 even when the baseplate 317 is lowered as more stacked substrates 302 are added into the sorting bin 140.

As discussed above, upon release of the sorted substrate 305 from the gripper, the sorted substrate 305 free-falls a distance 320 until contact is made with the uppermost stacked substrate 306. As is clear in FIG. 3, an inclination or planar orientation of the sorted substrate 305 upon release from the gripper is substantially horizontal relative to the base 155 supporting the sorting bin 140. For example, the sorted substrate 305 includes a major surface 350A having a plane, depicted as lines 325A and 325B, that are not substantially parallel to a plane, depicted as lines 330A and 330B, of a major surface 350B of the uppermost stacked substrate 306.

When the sorted substrate 305 is dropped from the gripper 130 and falls the distance 320, the inclination and/or the planar orientation of the sorted substrate 305 does not change significantly before contacting the uppermost stacked substrate 306. Therefore, one or more of a side 335A, a side 335B and a corner 340 of the sorted substrate 305 makes contact with the uppermost stacked substrate 306, which may cause damage to one or both of the sorted substrate 305 and the uppermost stacked substrate 306. For example, one or all of the side 335A, the side 335B and the corner 340 of the sorted substrate 305 may make contact with one or all of an adjacent side 312C and 312D, and a corner 345 of the uppermost stacked substrate 306, which may crack or chip one or both of the sorted substrate 305 and the uppermost stacked substrate 306.

While some conventional sorting systems use compressed air directed toward two or more of sides of the sorted substrate to effectively slow the rate of fall of the sorted substrate as it is released from the gripper, at least one embodiment of the rotary sorting system 120 as described herein may not. Instead, at least one embodiment of the rotary sorting system 120 as described herein relies on ambient air and/or ambient/atmospheric pressure between the major surfaces of the sorted substrate 305 that is falling from the gripper 130 and the uppermost stacked substrate 306. The air cushion effect utilizing ambient air and/or ambient/atmospheric pressure works most efficiently when the major surfaces of the sorted substrate and the stacked substrate are substantially parallel. However, the major surfaces of the sorted substrate 305 and the uppermost stacked substrate 306 are not parallel as shown in FIG. 3.

As such, the major surface 350A of the sorted substrate 305 is reoriented to be substantially parallel with the major surface 350B of the uppermost stacked substrate 306. An air nozzle 355 is utilized to reorient the sorted substrate 305. The air nozzle 355 is supported adjacent to the sorting bin 140 and/or under the sorted substrate 305. For example, the air nozzle 355 is positioned to direct pressurized air toward the major surface 350A of the sorted substrate 305 as the sorted substrate 305 falls the distance 320. The air nozzle 355 may be positioned to direct pressurized air at a corner, such as the corner 340, or a side, such as the side 335A so that the inclination of the falling substrate (i.e., the sorted substrate 305) is moved from the horizontal orientation to an angle that substantially matches the angles of the stacked substrates 302 in the sorting bin 140 (i.e., which is the same angle or inclination as the angle or inclination of the sorting bin 140). The air nozzle 355 may be positioned to direct pressurized air at a location between the corner 340 and the side 335A. In some embodiment, the air nozzle 355 is under the sorted substrate 305 for at least a portion of the sorted substrate 305 when it is falling the distance 320. For example, the gripper 130, traveling in the direction of travel 308, releases the sorted substrate 305 during such travel. As such, due to momentum that is retained by the sorted substrate 305, the sorted substrate 305 travels in the X/Y plane as it falls the distance 320. During this travel, the air nozzle 355 may be under the sorted substrate 305. In such a scenario, the air nozzle 355 may be timed to provide the pressurized air at or near the time when the side 335A passes thereover. In any scenario, the pressurized air from the air nozzle 355 reorients the major surface 350A of the sorted substrate 305 to be substantially parallel to the major surface 350B of the uppermost stacked substrate 306 as shown in FIG. 4.

Figure 4:
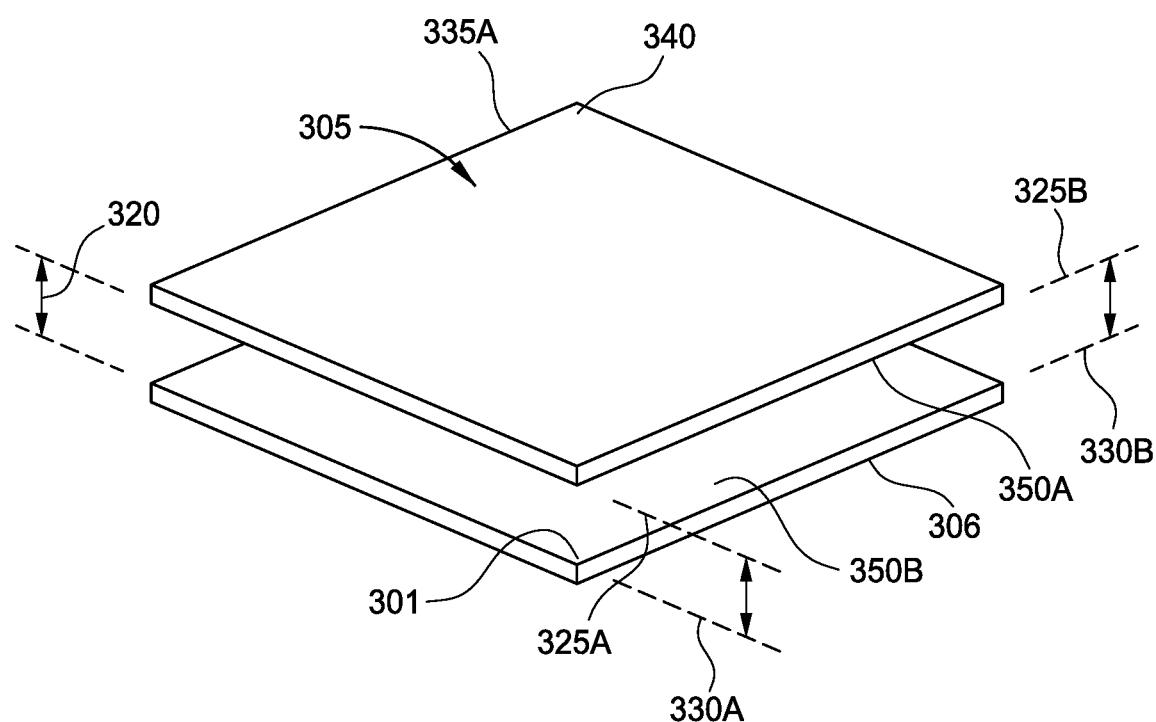
FIG. 4 is an isometric view of a sorted substrate being substantially parallel to the uppermost stacked substrate.

FIG. 4 is an isometric view of the sorted substrate 305 being substantially parallel to the uppermost stacked substrate 306. In particular, the plane (lines 325A and 325B) of the major surface 350A of the sorted substrate 305 are substantially equal to the plane (lines 330A and 330B) of a major surface 350B of the uppermost stacked substrate 306. This reorientation of the inclination of the sorted substrate 305 provides a substantially parallel relationship between the plane (lines 325A and 325B) of the major surface 350A of the sorted substrate 305 with the plane (lines 330A and 330B) of the major surface 350B of the uppermost stacked substrate 306. Substantially parallel as used herein is defined as up to about 10 degrees difference between the plane (lines 325A and 325B) of the major surface 350A of the sorted substrate 305 with the plane (lines 330A and 330B) of a major surface 350B of the uppermost stacked substrate 306. The reorientation of the sorted substrate 305 relative to the uppermost stacked substrate 306 after release from a gripper and/or prior to contact with therebetween provides a naturally occurring air cushion to develop which slows the sorted substrate 305 down slightly. The reorientation of the sorted substrate 305 relative to the uppermost stacked substrate 306 also prevents a single corner of the sorted substrate 305 from first impacting the uppermost stacked substrate 306 within the sorting bin 140. The reorientation and/or the air cushion thus reduces the probability of chipping which prevents damage to either or both of the sorted substrate 305 and/or the uppermost stacked substrate 306.

Referring again to FIG. 3, an angle $\alpha$ of the air nozzle 355 is adjustable. For example, the angle $\alpha$ is adjustable from about zero degrees to about 45 degrees relative to the plane (lines 325A and 325B) of the major surface 350A of the sorted substrate 305. In one example, the angle $\alpha$ is about 5 degrees to about 15 degrees from a reference plane. The reference plane includes one or both of an X-Y plane (based on the directional inset of FIG. 3) and a plane of a horizontal surface of the base 155 of the rotary sorting system 120 (shown in FIGS. 2 and 3) after the rotary sorting system 120 is leveled.

It will be appreciated to those skilled in the art that the preceding examples are exemplary and not limiting. It is intended that all permutations, enhancements, equivalents, and improvements thereto that are apparent to those skilled in the art upon a reading of the specification and a study of the drawings are included within the true spirit and scope of the present disclosure. It is therefore intended that the following appended claims include all such modifications, permutations, and equivalents as fall within the true spirit and scope of these teachings.

What is claimed is:

1. An apparatus for sorting a plurality of substrates, the apparatus comprising:
   a sorting unit capable of supporting a plurality of sorting bins;
   a rotatable support disposed within the sorting unit, the rotatable support rotatable about a rotational axis;
   a plurality of grippers coupled to the rotatable support on a common radius relative to the rotational axis, the grippers positioned to travel along a path about the rotational axis above the sorting bins as the rotatable support rotates; and
   an air nozzle configured to rotate a sorted substrate relative to a stacked substrate, while the sorted substrate falls from the gripper into a sorting bin of the plurality of sorting bins when released by one of the grippers into the sorting bin.

2. The apparatus of claim 1, wherein each of the grippers is a Bernoulli picker.

3. The apparatus of claim 1, wherein each of the grippers is a contactless gripper.

4. The apparatus of claim 1, further comprising a loading unit coupled with a metrology unit, wherein the metrology unit is coupled with the sorting unit.

5. The apparatus of claim 1, wherein the plurality of sorting bins are vertically movable relative to the grippers.

6. The apparatus of claim 1, wherein the plurality of sorting bins are individually removable from outside the sorting unit, and wherein the plurality of sorting bins may be individually removed while sorting is occurring.

7. The apparatus of claim 1, further comprising a computer-readable medium storing instructions that, when executed by a processor, cause the apparatus to sort the plurality of substrates by:
  holding the substrate with at least one gripper of the sorting unit;
  rotating the substrate held by the at least one gripper about a center axis of the sorting unit to a location above the sorting bin assigned to the substrate; and
  releasing the substrate from the at least one gripper into the assigned sorting bin.

8. An apparatus adapted to sort substrates, comprising:
  a sorting unit capable of supporting a plurality of individually removable sorting bins, wherein the sorting unit comprises:
    a support structure extending radially outward from an axis of rotation;
    at least one gripper coupled to the support structure for supporting a substrate, the at least one gripper positioned to travel along a circular path above the individually removable sorting bins as the at least one gripper rotates; and
    an air nozzle positioned to direct pressurized air to rotate a sorted substrate and reorient a planar orientation of the substrate after release from the at least one gripper as the substrate falls from the at least one gripper.

9. The apparatus of claim 8, further comprising a computer-readable medium storing instructions that, when executed by a processor, cause the apparatus to sort the substrates by:
  holding the substrate with at least one gripper of the sorting unit;
  rotating the substrate held by the at least one gripper about a center axis of the sorting unit to a location above the sorting bin assigned to the substrate; and
  releasing the substrate from the at least one gripper into the assigned sorting bin.

10. The apparatus of claim 8, wherein the at least one gripper is a Bernoulli picker.

11. The apparatus of claim 8, wherein the at least one gripper is a contactless gripper.

12. The apparatus of claim 8, wherein each individually removable sorting bin comprises a plurality of gas outlets operable to generate a pressurized gas support cushion within the individually removable sorting bins.

13. A method of operating an apparatus for sorting a plurality of substrates in an enclosure, the method comprising:
  holding an inspected substrate with at least one gripper on a rotating sorting unit in a circular rotation path;
  rotating the inspected substrate held by the at least one gripper about a center axis of the sorting unit in the circular rotation path to a location above a sorting bin assigned to the inspected substrate, wherein the sorting bin includes a baseplate having a plane that is angled in a non-horizontal plane;
  releasing the inspected substrate from the at least one gripper in a horizontal planar orientation into the assigned sorting bin; and
  reorienting the planar orientation of the inspected substrate after the inspected substrate is released from the at least one gripper prior to resting within the assigned sorting bin.

14. The method of claim 13, wherein the reorienting includes positioning the planar orientation of the inspected substrate to be substantially parallel to the non-horizontal plane of the baseplate.

15. The method of claim 13, wherein the reorienting comprises directing pressurized air against a corner of the inspected substrate after the inspected substrate is released from the at least one gripper.

16. The method of claim 15, wherein directing pressurized air against the inspected substrate rotates the inspected substrate during free-fall into the assigned sorting bin.

17. The method of claim 13, wherein directing pressurized air against a corner of the inspected substrate rotates the inspected substrate during free-fall into the assigned sorting bin.

18. The method of claim 17, wherein the reorienting includes repositioning the plane of the substrate to be substantially parallel to a plane of one or more stacked substrates disposed in the assigned sorting bin.

19. The method of claim 18, wherein the at least one gripper is vertically fixed and the baseplate is vertically movable relative to the at least one gripper.

20. The method of claim 13, wherein the assigned sorting bin is removable while the sorting unit is rotating.

* * * * *